United States Patent [19]

Tise

[11] Patent Number: 4,659,648
[45] Date of Patent: Apr. 21, 1987

[54] PLASMA DEVELOPABLE PHOTORESIST COMPOSITIONS CONTAINING N-SUBSTITUTED 3-VINYLCARBAZOLES

[75] Inventor: Frank P. Tise, Wilmington, Del.

[73] Assignee: Hercules Incorporated, Wilmington, Del.

[21] Appl. No.: 789,601

[22] Filed: Oct. 21, 1985

[51] Int. Cl.[4] .................. G03C 1/70; G03C 1/76; G03C 1/94; G03C 5/16
[52] U.S. Cl. .................. 430/272; 430/281; 430/277; 430/278; 430/18; 430/325; 522/67; 522/167
[58] Field of Search ............... 430/281, 272, 277, 278, 430/18, 325; 522/67, 167

[56] References Cited

U.S. PATENT DOCUMENTS

| | | | |
|---|---|---|---|
| 2,791,504 | 5/1957 | Plambeck | 430/325 |
| 3,899,338 | 8/1975 | Lewis | 96/115 |
| 3,978,029 | 8/1976 | Limburg | 526/282 X |
| 4,113,592 | 9/1978 | Rybny et al. | 430/923 X |
| 4,278,753 | 7/1981 | Lewis et al. | 430/283 |
| 4,302,522 | 11/1981 | Garnett et al. | 430/133 |

Primary Examiner—John E. Kittle
Assistant Examiner—Cynthia Hamilton
Attorney, Agent, or Firm—Marion C. Staves; William E. Player

[57] ABSTRACT

Disclosed is a photoresist using a 3-vinylcarbazole as the photopolymerizable monomer.

9 Claims, No Drawings

PLASMA DEVELOPABLE PHOTORESIST COMPOSITIONS CONTAINING N-SUBSTITUTED 3-VINYLCARBAZOLES

BACKGROUND OF THE INVENTION

The present invention relates to photoresists. More particularly it relates to novel monomers in photoresists that are polymerizable in the presence of oxygen.

Monomers whose polymerization is insensitive to air are uncommon, since most monomers react by free-radical mechanisms, which are strongly inhibited by oxygen. However, air insensitive monomers are very desirable for use in photoresists, which are polymerized under conditions where the diffusion of oxygen is particularly facile.

U.S. Pat. No. 3,899,338 issued to J. M. Lewis, discloses the use of an N-vinylcarbazole as the photopolymerizable monomer in a photoresist. These monomers are polymerizable in the presence of oxygen and give good photospeed. However, appending useful functional groups to N-vinylcarbazoles is difficult, for example, appending an alkyl group to the number 3 position of N-vinylcarbozole renders it unstable and necessitates its immediate use under anhydrous conditions.

SUMMARY OF THE INVENTION

According to the invention, a photoresist containing an oxygen-insensitive, photopolymerizable monomer is characterized in that the monomer is a 3-vinylcarbazole compound. Various functional groups are easily appended to 3-vinylcarbazole to create stable photopolymerizable monomers for use in photoresists.

DETAILED DESCRIPTION OF THE INVENTION

The 3-vinylcarbazole compounds that are useful in accordance with this invention have the general formula

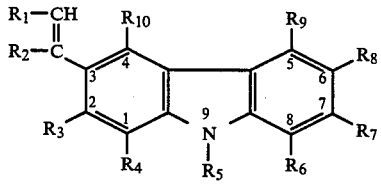

wherein $R_1$–$R_4$, and $R_6$–$R_{10}$ are each independently hydrogen, a lower alkyl group or a lower alkylene group, and $R_5$ is hydrogen a lower alkyl group, or an organo silyl group having the general formula

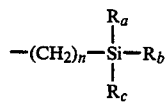

wherein $R_a$, $R_b$, and $R_c$ are each independently a lower alkyl group or a lower alkoxy group and n is an integer from 0 to 3.

Typical 3-vinylcarbazoles of this invention are, for example, 3,6-divinyl-N-ethylcarbazole, 3-(1-propenyl)-6-methyl-N-ethylcarbazole, 3-vinyl-7-propyl-N-methylcarbazole, 3-vinyl-4-methyl-N-(3-propenyl)carbazole, 3-(2-propenyl)-1,8-dimethylcarbazole, and 1,3-divinyl-2-methylcarbazole. Especially preferred are 3-vinylcarbazoles where $R_5$ is a silicon containing group. Typical of these compounds, for example, is 3-(2-propenyl)-N-trimethylsilylmethylcarbazole, 3-vinyl-N-(3-trimethylsilylpropyl)carbazole, 3-vinyl-N-(2-trimethoxysilyethyl)carbazole, 3-vinyl-N-triethoxysilylmethylcarbazole, and 3-(2-propenyl)-N-methyldimethoxysilylmethylcarbazole.

The availability of the nitrogen moiety as a binding site for various functional groups is evidenced by this example of an especially preferred compound. The nitrogen functionality provides a site at which moieties containing useful functional groups can easily be attached, to form stable compounds useful in photoresist formulations. This availability is an important distinction over the N-vinylcarbazoles of the prior art.

The essential components of the photoresists of this invention are a 3-vinyl-carbazole, a photoinitiator, a solvent, and a polymeric binder. Photoinitiators useful in accordance with this invention are selected from tetraiodoethylene, $\alpha,\beta,\beta$-triiodostyrene, iodoform, bromoform, and hexabromoethane. Typical polymeric binders useful in accordance with this invention are film forming binders that do not phase separate from the other photoresist components. Suitable binders are, for example, polyvinylbutyral, vinylalcohol-vinylacetate copolymer, vinylchloride-vinylacetate copolymer, polyvinylpropionate, polyvinylbutyrate, styrenevinylketone copolymers, and polyvinylketones. Other suitable binders will be apparent to those skilled in the art. The solvents used in accordance with this invention are organic solvents, such as for example, chlorobenzene, diacetone alcohol, dimethylformamide, xylene, methyl isobutyl ketone, dichlorobenzene, dimethylsulfoxide, N-butanol and toluene. Other useful organic solvents will be apparent to those skilled in the art.

Preferably, also present in the photoresist are stabilizers and photosensitizers, etc. Suitable stabilizers are described in U.S. Pat. No. 3,351,467, incorporated herein by reference. Suitable photosensitizers are perylene and photosensitizers described in U.S. Pat. No. 3,899,338, also incorporated by reference herein.

Amounts of the various photoresist components in the photoresist composition can vary. In parts by weight of the photoresist, the relative proportions are: monomer (3-vinylcarbazole), about 2 to about 40, preferably about 4 to about 15; photoinitiator, about 0.2 to about 5, preferably about 0.7 to about 3; polymeric binder, 1.5 to about 40, preferably 3 to about 12; photosensitizer, 0 to about 1, preferably 0.1 to about 0.5; stabilizer, 0 to about 0.5, preferably 0.05 to about 0.2; solvent, about 40 to about 95, preferably about 60 to about 90. Various methods for mixing the photoresist components are well known to those skilled in the art. Typically, the various components are tumble blended over several hours.

In a particular embodiment of this invention, the photoresists containing the 3-vinylcarbazole monomer is used to make photoresist elements that are usef in making microelectronic devices, such as for example, printed circuits and integrated circuits. These elements are made by coating the photoresist onto a suitable substrate, irradiating the photoresist through a phototool (negative) to polymerize the monomers therein, and developing the irradiated photoresist to form an image on the substrate which corresponds to the irradiated area of the photoresist. The photoresist is coated onto the substrate as a liquid, and the solvent is then evaporated. Suitable substrates are, for example, silicon, copper, or aluminum. Suitable radiation is electromagnetic radiation sufficient to polymerize the monomer. The wavelength of the electromagnetic radiation varies depending upon the photoresist ingredients and is about 300 angstroms to about 8,000 angstroms. Alternatively, electron beam radiation can also be used. Prior to exposure, the photoresist is normally "soft baked" to remove residual solvent.

Suitable developing techniques will be apparent to those skilled in the art; both wet and dry techniques can be used, with dry techniques such as oxidative plasmas and reactive ion etching preferred. An especially preferred dry technique is oxygen plasma development. When dry techniques are employed, an additional "hard bake" step is needed prior to development to remove the unpolymerized monomer from the unexposed areas.

EXAMPLES

The following examples further illustrate the instant invention, but the instant invention is not limited thereto. All parts are by weight unless indicated otherwise.

EXAMPLE 1

A preferred example is the use of 3-(2-propenyl)-N-trimethylsilylmethylcarbazole as the polymerizable monomer in a photoresist. 3-Bromocarbazole is prepared by treating carbazole in pyridine with a solution of bromine in pyridine. The purified product is converted to the N-trimethylsilylmethyl derivative by sequential treatment in tetrahydrofuran with sodium hydride and chloromethyltrimethylsilane, followed by refluxing. The purified product is treated with n-butyllithium, acetone, and worked up to give an intermediate alcohol, which is converted to 3(2-propenyl)-N-trimethylsilylmethylcarbazole by treatment with thionyl chloride in pyridine at 50° C. The product is purified by column chromatography to give a very viscous liquid.

The photoresist is prepared from 0.55 parts of the monomer, 0.02 parts of perylene (a photosensitizer), 0.46 parts of polyvinylbutyral, 0.12 parts of tetraiodoethylene, 0.01 parts of 2,6-di-tert-butylcresol, 5.44 parts of chlorobenzene, and 1.36 parts of n-butanol. The ingredients are mixed by tumbling overnight. This and all of the subsequent operations are preformed under yellow light.

A 3" silicon wafer is coated with a few ml of the photoresist using a Headway EC101 Photo-Resist Spinner, and spun for 30 sec at 6000 rpm. The coated wafer is placed on a 5.5"×8" 12 gauge aluminum tray, which is placed on a heat sink in the bottom of a horizontal airflow mechanical convection oven and soft baked for 5 minutes. The oven temperature is 65° C., with an airflow of 16.7 ft$^3$/min. The wafer is allowed to cool, and the coating is scratched with a No. 16 X-Acto blade. A coating thickness of 10,000 A is measured at this scratch, using an Alpha-Step Profiler having a stylus radius of 12.5 uM and a stylus force of 15 mg.

One half of the coated side of the wafer is exposed for 28 sec on a Cobilt CA-400 Wafer Alignment System equipped with a mercury lamp. A light intensity of 3.5 mw/cm$^2$ is measured at the exposure plane, using an International Light's IL-400 Photoresist Radiometer.

To hard bake the wafer, it is placed on a stainless steel platen in a vacuum chamber, and the pressure is brought to 0.7 torr. The platen is heated electrically at such a rate that its temperature reaches 105° C. in 2 min 20 sec, and is 110° C. after 5 min, at which time the wafer is removed. Upon scratching and measuring as described above, the coating is found to be 9500 A and 6200 A thick on the exposed and unexposed halves, respectively.

The wafer is developed in a parallel plate plasma unit using a 1-torr atmosphere of 1:1 oxygen/argon, a radio frequency energy density of 0.2 W/cm$^2$, and a platen temperature of 40±0.1° C. Temperature is regulated by a Haabe E-12 Immersion and Suspension Controller. After five two-minute plasma treatments, there is no measurable coating thickness on the unexposed half of the wafer, while 9000 A remain on the exposed half.

EXAMPLE 2

Another preferred example, also for use in a photoresist application, is a 3,6-divinyl-N-ethylcarbazole. 3,6-Diacetyl-N-ethylcarbazole is prepared by treating a mixture of N-ethylcarbazole and aluminum chloride in carbon disulfide with a mixture of acetyl chloride and acetyl bromide. The crude product is converted with sodium borohydride in refluxing 2-propanol to the corresponding secondary diol, which is in turn refluxed with phosphorus oxychloride and 4-dimethylaminopyridine in pyridine to afford the monomer as long white needles, MP 88°–93° C., after purification.

A photoresist is prepared from 0.975 parts of the monomer, 1.66 parts of polyvinyl formal, 0.51 parts of tetraiodoethylene, 0.049 parts of 2,6-di-tert-butylcresol, 16.94 parts of chlorobenzene, and 4.24 parts of n-butanol. (Preparation and testing of the photoresist are as described in Example 1, except as noted.)

The photoresist is coated onto a silicon wafer by spinning for 30 sec at 5500 rpm and soft baked at 65° for 5 min as in Example 1, to give a coating of 11,000 A thick. The wafer is exposed for 14 sec at an intensity of 3.0 mW/cm$^2$, in contact with an RCA resolution test mask, whereupon it is hard baked for 30 min using the same equipment as in the soft bake, except that the tray is rested on a 6"×8"×¼" aluminum plate in a 110° C. oven having an air flow of 10 ft$^3$/min. Plasma development for 10 min and then another 3 min results in essentially complete removal of photoresist from unexposed areas, while 4600 A of resist thickness remains on an exposed 10 A-wide bar.

I claim:
1. A photoresist comprising:
(a) at least one monomer having the general formula

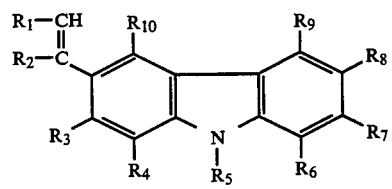

wherein $R_1$–$R_4$, and $R_6$–$R_{10}$ are each independently hydrodgen, a $C_1$–$C_3$ alkyl group or a $C_1$–$C_3$ alkylene group, and $R_5$ is hydrogen, a $C_1$–$C_3$ alkyl group, or an organo silyl group having the general formula

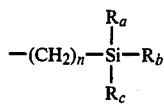

wherein $R_a$, $R_b$, and $R_c$ are each independently a $C_1$-$C_3$ alkyl group or a $C_1$-$C_3$ alkoxy group and n is an integer from 0 to 3;

(b) a photoinitiator selected from the group consisting of tetraiodoethylene, $\alpha,\alpha,\beta,\beta$-triiodostyrene, iodoform, bromoform, and hexabromoethane;

(c) a film forming chemical binder that does not phase separate from the rest of the photoresist; and (d) a solvent.

2. The photoresist of claim 1 wherein the monomer is 3-(2-propenyl)-N-trimethylsilylmethylcarbazole.

3. The photoresist of claim 1 wherein the monomer is 3,6-divinyl-N-ethylcarbazole.

4. In a photoresist comprising a haloalkene photoinitiator, a monomer polymerizable by the photodecomposition of the photoinitiator, a polymeric binder, and a solvent, the improvement wherein the monomer comprises:

(a) at least one monomer having the general formula

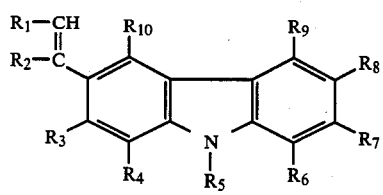

wherein $R_1$-$R_4$, and $R_6$-$R_{10}$ are each independently hydrogen, a $C_1$-$C_3$ alkyl group or a $C_1$-$C_3$ alkylene group, and $R_5$ is hydrogen, a $C_1$-$C_3$ alkyl group, or an organo silyl group having the general formula

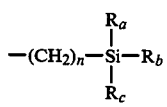

wherein $R_a$, $R_b$, and $R_c$ are each independently a $C_1$-$C_3$ alkyl group or a $C_1$-$C_3$ alkoxy group and n is an integer from 0 to 3.

5. A photoresist element comprising a substrate, wherein the substrate is silicon, copper or aluminum, coated with a photoresist composition comprising:

(a) at least one monomer having the general formula

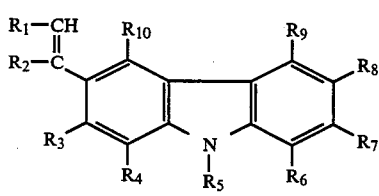

wherein $R_1$-$R_4$, and $R_6$-$R_{10}$ are independently hydrogen, a $C_1$-$C_3$ alkyl group or a $C_1$-$C_3$ alkylene group, and $R_5$ is hydrogen, a $C_1$-$C_3$ alkyl group, or an organo silyl group having the general formula

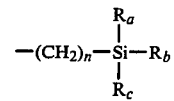

wherein $R_a$, $R_b$, and $R_c$ are each independently a $C_1$-$C_3$ alkyl group or a $C_1$-$C_3$ alkoxy group and n is a integer from 0 to 3;

(b) a photoinitiator selected from the group consisting of tetraiodoethylene, $\alpha,\alpha,\beta,\beta$-triiodostyrene, iodoform, bromoform, and hexabromoethane;

(c) a film forming chemical binder that does not phase separate from the rest of the photoresist; and (d) a solvent.

6. The photoresist element of claim 5 irradiated imagewise sufficiently to polymerize the monomer in the irradiated areas of the photoresist.

7. The photoresist element of claim 6 wherein the nonirradiated photoresist has been removed from the substrate.

8. A method of making a photoresist comprising combining:

(a) at least one monomer having the general formula

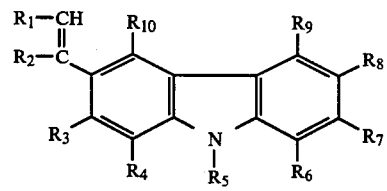

wherein $R_1$-$R_4$, and $R_6$-$R_{10}$ are each independently hydrogen, a $C_1$-$C_3$ alkyl group or a $C_1$-$C_3$ alkylene group, and $R_5$ is hydrogen, a $C_1$-$C_3$ alkyl group, or an organo silyl group having the general formula

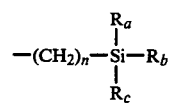

wherein $R_a$, $R_b$, and $R_c$ are each independently a $C_1$-$C_3$ alkyl group or a $C_1$-$C_3$ alkoxy group and n is an integer from 0 to 3;

(b) a photoinitiator selected from the group consisting of tetraiodoethylene, $\alpha,\alpha,\beta,\beta$-triiodostyrene, iodoform, (c) a film forming chemical binder that does not phase separate from the rest of the photoresist; and (d) a solvent.

9. The method of claim 8 further comprising the steps of:

(1) coating the photoresist onto a substrate wherein the substrate is silicon, copper, or aluminum;

(2) irradiating the photoresist imagewise sufficiently to polymerize the monomer in the irradiated areas;

(3) removing the non-irradiated photoresist from the substrate.

* * * * *

UNITED STATES PATENT AND TRADEMARK OFFICE
CERTIFICATE OF CORRECTION

PATENT NO. : 4,659,648
DATED : April 21, 1987
INVENTOR(S) : Frank P. Tise

It is certified that error appears in the above-identified patent and that said Letters Patent are hereby corrected as shown below:

Column 3, line 64 "IL-400"

should read -- IL-440 --.

In the claims 1, 5 and 8, line 11, 13 and 54 respectively "$\alpha, \alpha$" should read --$\alpha$--.

Signed and Sealed this

Eleventh Day of August, 1987

Attest:

DONALD J. QUIGG

Attesting Officer    Commissioner of Patents and Trademarks